(12) United States Patent
Han

(10) Patent No.: US 8,735,189 B2
(45) Date of Patent: May 27, 2014

(54) FLIP LIGHT EMITTING DIODE CHIP AND METHOD OF FABRICATING THE SAME

(75) Inventor: Chang Han, Pleasanton, CA (US)

(73) Assignee: Starlite LED Inc, Fremont, CA (US)

( * ) Notice: Subject to any disclaimer, the term of this patent is extended or adjusted under 35 U.S.C. 154(b) by 0 days.

(21) Appl. No.: 13/474,656

(22) Filed: May 17, 2012

(65) Prior Publication Data

US 2013/0306964 A1    Nov. 21, 2013

(51) Int. Cl.
| H01L 21/00 | (2006.01) |
| H01L 21/50 | (2006.01) |
| H01L 21/48 | (2006.01) |
| H01L 29/267 | (2006.01) |
| H01L 31/12 | (2006.01) |
| H01L 29/22 | (2006.01) |
| H01L 31/0203 | (2006.01) |
| H01L 25/16 | (2006.01) |
| H01L 33/08 | (2010.01) |
| H01L 51/52 | (2006.01) |

(52) U.S. Cl.
CPC .............. *H01L 25/167* (2013.01); *H01L 33/08* (2013.01); *H01L 51/5253* (2013.01); *H01L 51/5237* (2013.01)
USPC ................. 438/26; 438/38; 438/121; 257/81; 257/99; 257/433

(58) Field of Classification Search
CPC ... H01L 25/167; H01L 33/08; H01L 51/5253; H01L 51/5237
USPC ................... 438/26, 38, 121; 257/81, 99, 433
See application file for complete search history.

(56) References Cited

U.S. PATENT DOCUMENTS

| 6,740,906 | B2 * | 5/2004 | Slater et al. ..................... 257/99 |
| 8,476,644 | B2 * | 7/2013 | Illek et al. ....................... 257/79 |
| 2004/0211972 | A1 * | 10/2004 | Du et al. .......................... 257/99 |
| 2005/0056855 | A1 * | 3/2005 | Lin et al. .......................... 257/98 |
| 2006/0261364 | A1 * | 11/2006 | Suehiro et al. ................ 257/100 |
| 2008/0074029 | A1 * | 3/2008 | Suehiro ......................... 313/487 |

* cited by examiner

*Primary Examiner* — Luan C Thai
(74) *Attorney, Agent, or Firm* — Alston & Bird LLP

(57) ABSTRACT

A method of fabricating a light emitting diode device comprises providing a substrate, growing an epitaxial structure on the substrate. The epitaxial structure includes a first layer on the substrate, an active layer on the first layer and a second layer on the active layer. The method further comprises depositing a conductive and reflective layer on the epitaxial structure, forming a group of first trenches and a second trench. Each of the first and second trenches extends from surface of the conductive and reflective layer to the first layer to expose part of the first layer. The method further comprises depositing conductive material to cover a portion of the conductive and reflective layer to form a first contact pad, and cover surfaces between adjacent first trenches to form a second contact pad. The second contact pad electrically connects the first layer by filling the conductive material in the first trenches.

27 Claims, 16 Drawing Sheets

FLIP LIGHT EMITTING DIODE CHIP AND METHOD OF FABRICATING THE SAME

TECHNICAL FIELD

The example embodiments of the present invention generally relate to light emitting diodes device, and more particularly to flip light emitting diode chips and method of fabricating the same.

BACKGROUND

There are two fundamental ways to envisage light emitting diode chips, i.e., a lateral and a vertical die structure. FIG. 1(a) shows a lateral light emitting diode chip 100 of the prior art. FIG. 1(b) illustrates the lateral light emitting diode chip 100 assembled to a printed circuit board 160. With reference to FIG. 1(a), the lateral light emitting diode chip 100 includes a substrate 102, an n-type GaN layer 104 on the substrate 102, an active layer 106 on the n-type GaN layer 104, a p-type GaN layer 108 on the active layer 106, and contact pads 110 on the n-type GaN layer 104 and the p-type GaN layer 108 respectively. As shown in FIGS. 1(a) and 1(b), when the light emitting diode chip 100 is assembled to the printed circuit board 160, a lead frame 114 connects the contact pads 110 of the light emitting diode chip 100 to contact pads 168 of the printed circuit board 160.

FIG. 2(a) illustrates a vertical light emitting diode chip 200 of the prior art. FIG. 2(b) illustrates the vertical light emitting diode chip 200 assembled to a printed circuit board of the prior art. Similar to the lateral structure, the vertical light emitting diode chip 200 includes a substrate 202, an n-type GaN layer 204 on the substrate 202, an active layer 206 on the n-type GaN layer 204, a p-type GaN layer 208 on the active layer 206, and a contact pad 210 on the p-type GaN layer 208. As shown in FIG. 2(b), a lead frame 214 connects the contact pads (not numbered) of the light emitting diode chip 200 to contact pads 268 of a printed circuit board (not numbered).

As the light emitting diode chips (100, 200) are wiring bonded to the printed circuit boards, the heat generated in the active region may propagate through the substrate (102, 202) before being dissipated into the printed circuit board.

BRIEF SUMMARY

According to one exemplary embodiment of the present invention, a method of fabricating a light emitting diode device comprises providing a substrate, growing an epitaxial structure on the substrate. The epitaxial structure includes a first layer on the substrate, an active layer on the first layer and a second layer on the active layer. The method further comprises depositing a conductive and reflective layer on the epitaxial structure, forming a group of first trenches and a second trench. Each of the first and second trenches extends from surface of the conductive and reflective layer to the first layer to expose part of the first layer. The method further comprises depositing conductive material to cover a portion of the conductive and reflective layer to form a first contact pad, and cover surfaces between adjacent first trenches to form a second contact pad. The second contact pad electrically connects the first layer by filling the conductive material in the first trenches. The first contact pad is spatially separated from the second contact pad by the second trench.

According to one exemplary embodiment of the present invention, a light emitting diode device comprises a substrate, an epitaxial structure grown on the substrate, a conductive layer deposited on the epitaxial structure. The epitaxial structure includes a first layer having a first material, an active layer on the first layer, the active layer having a second material and a second layer on the active layer. The second layer has the first material. The first layer and the second layer include different types of doping. The first material has wider band gap than that of the second material. The light emitting diode device further comprises a first contact pad formed on the conductive layer and a second contact pad covering surfaces between adjacent first trenches. The first contact pad is spatially separated from the second contact pad by a second trench. The second contact pad electrically connects to the first layer by filling conductive material in the first trenches. The first and second trenches extend from the conductive layer to the first layer to expose part of the first layer.

According to one exemplary embodiment of the present invention, a method of assembling a light emitting diode device to a metal core printed circuit board comprises electrically connecting the first and second contact pads of the light emitting diode device to first and second conductive pads of the metal core printed circuit board respectively, coupling a most upper layer to a mesa structure of the metal core printed circuit board.

BRIEF DESCRIPTION OF THE DRAWING(S)

Having thus described the example embodiments of the present invention in general terms, reference will now be made to the accompanying drawings, which are not necessarily drawn to scale, and wherein:

Figure 1A:
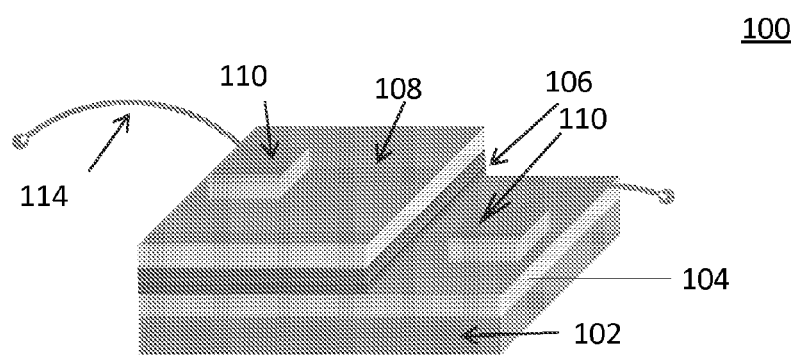
FIG. 1(a) illustrates a lateral light-emitting diode chip of the prior art.
Figure 1B:
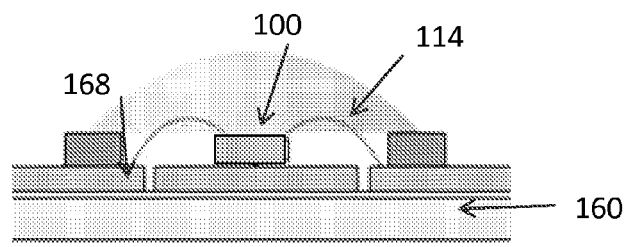
FIG. 1(b) illustrates a lateral light-emitting diode chip assembled to a metal core printed circuit board.
Figure 2A:
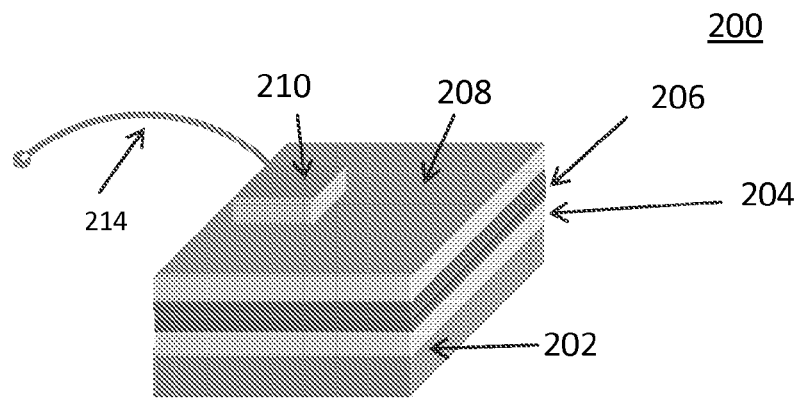
FIG. 2(a) illustrates a vertical light-emitting diode chip of the prior art.
Figure 2B:
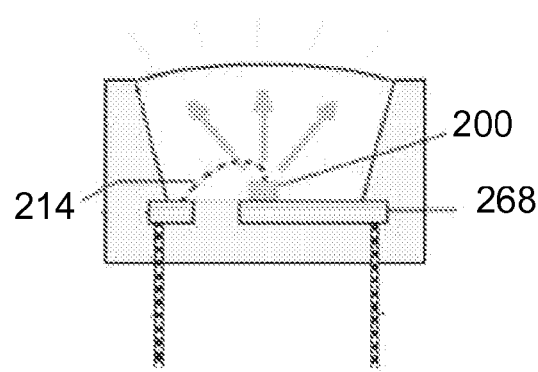
FIG. 2(b) illustrates a vertical light-emitting diode chip assembled to a metal core printed circuit board.
Figure 3A:
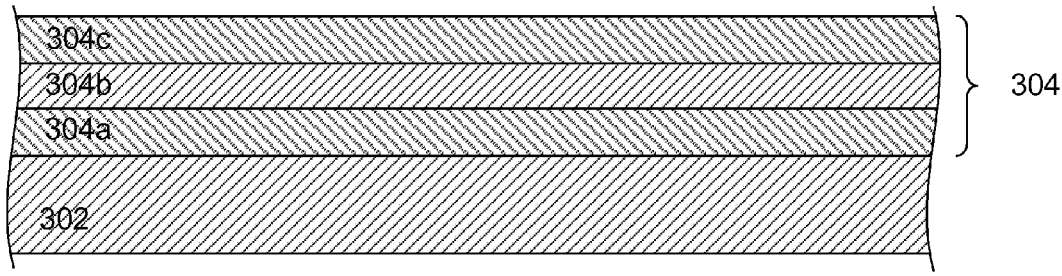
Figure 3B:
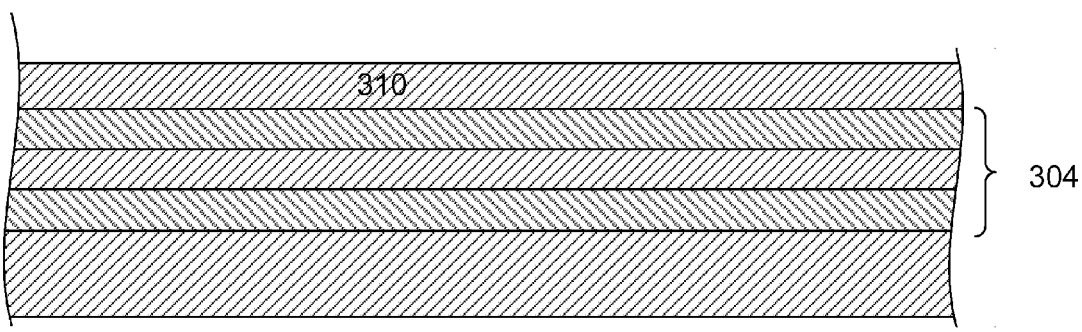
Figure 3C:
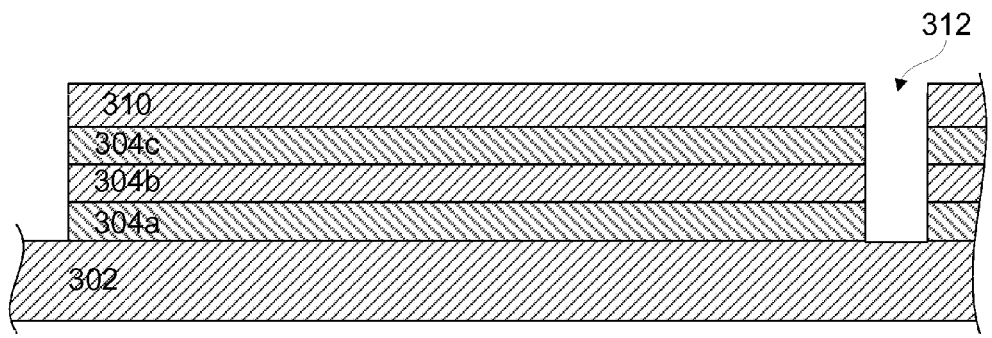
Figure 3D:
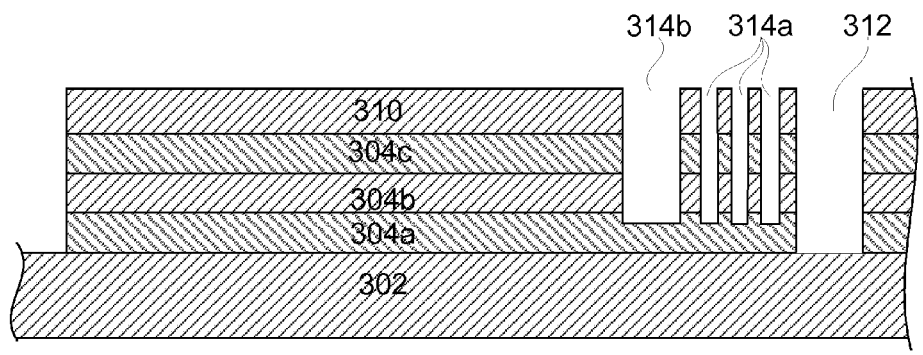
Figure 3E:
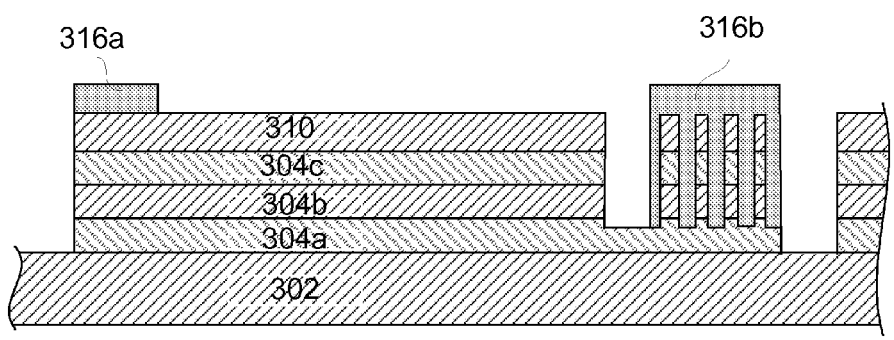
Figure 3F:
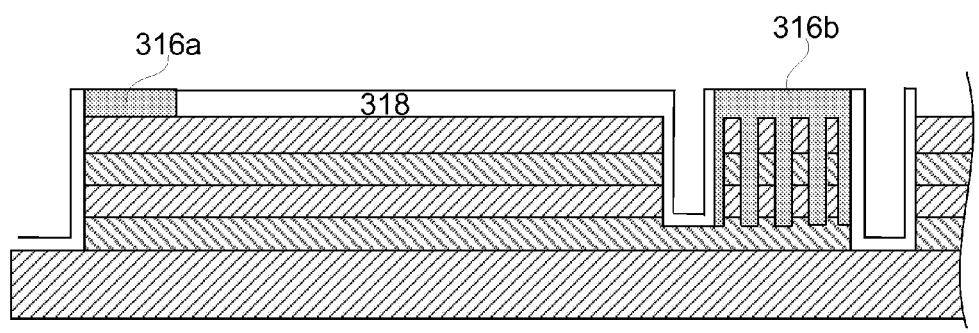
Figure 3G:
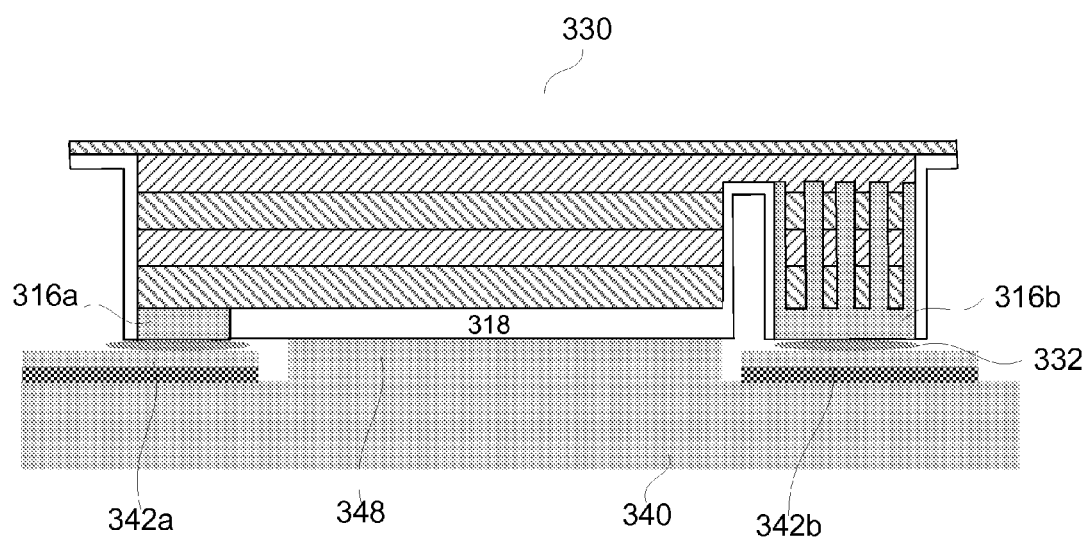
Figure 3H:
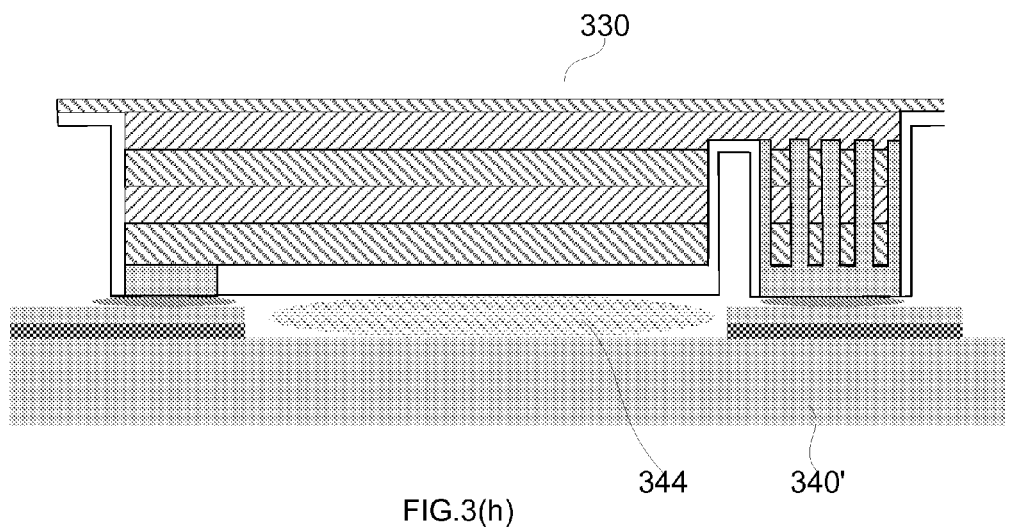
Figure 4A:
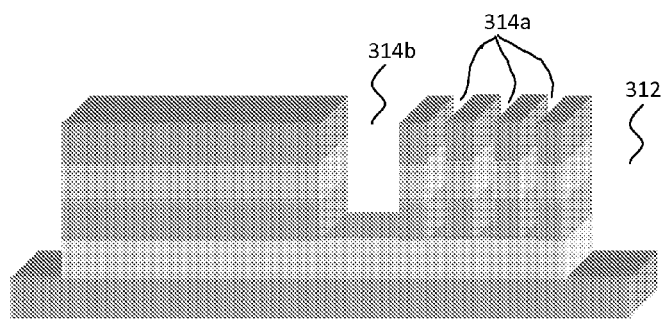
Figure 4B:
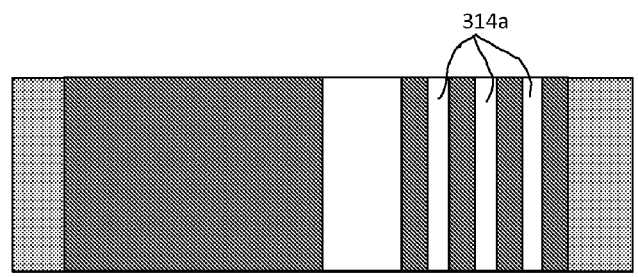
Figure 4C:
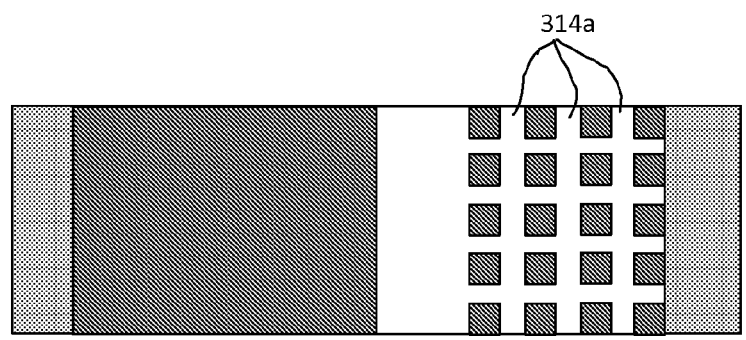
Figure 4D:
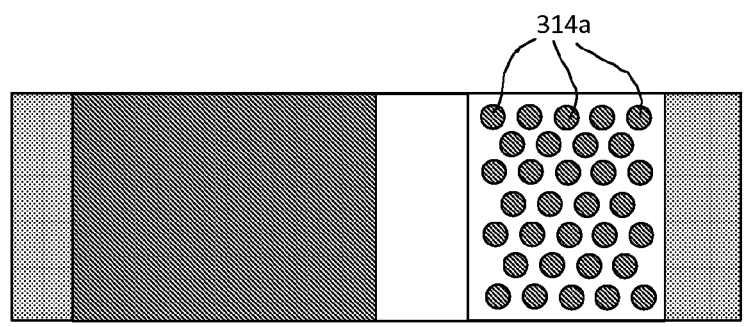

FIGS. 3(a)-3(f) are cross-sectional views to illustrate process of fabricating a flip light emitting diode chip according to one example embodiment of the present invention;

FIGS. 3(g)-3(h) are cross-sectional views to illustrate a flip light emitting diode chip having a single passivation layer assembled to a printed circuit board according to one example embodiment of the present invention;

FIG. 4(a) illustrates a 3-D view of trenches formed in FIG. 3(d);

FIGS. 4(b)-4(d) illustrate top views of exemplary trenches formed in FIG. 3(d).

Figure 5A:
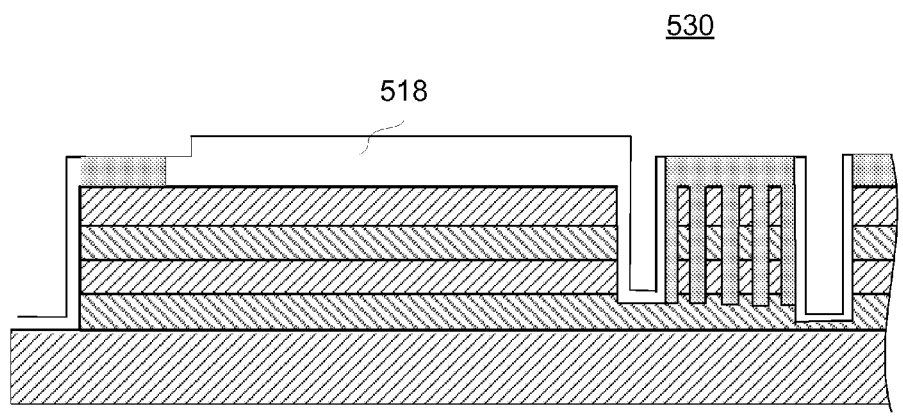
Figure 5B:
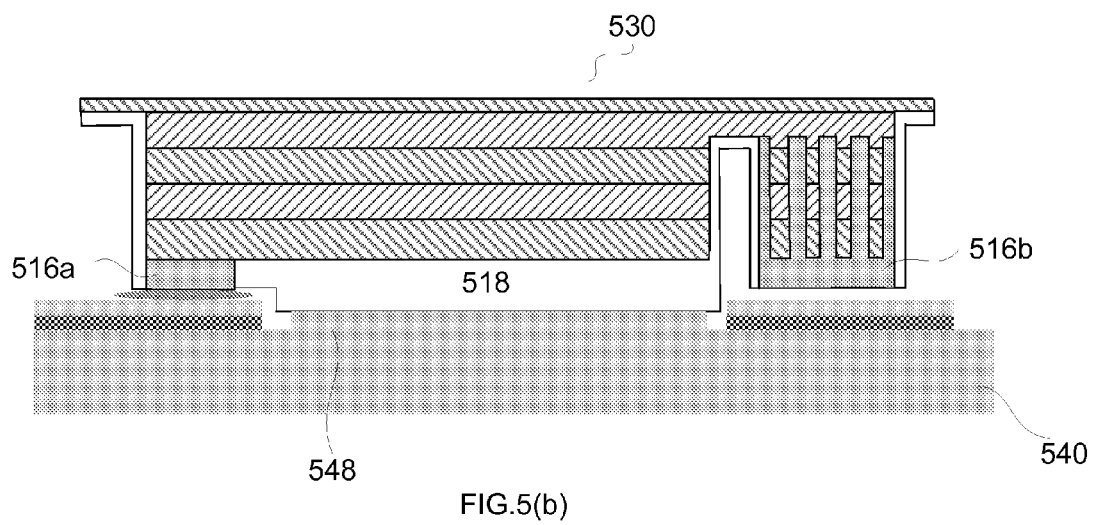
Figure 6A:
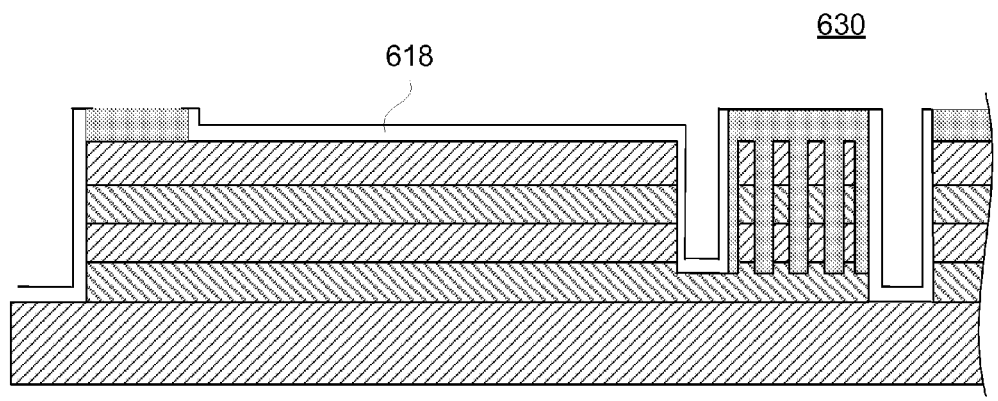
Figure 6B:
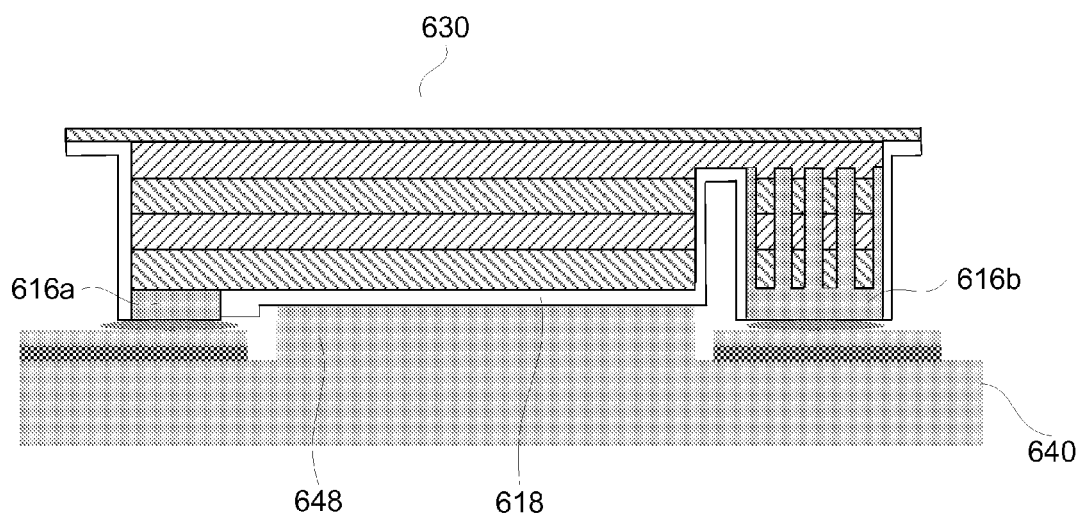
Figure 7A:
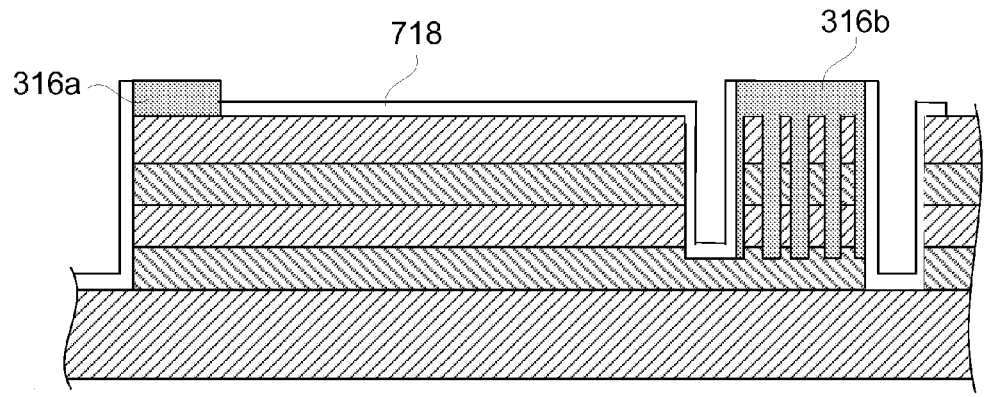
Figure 7B:
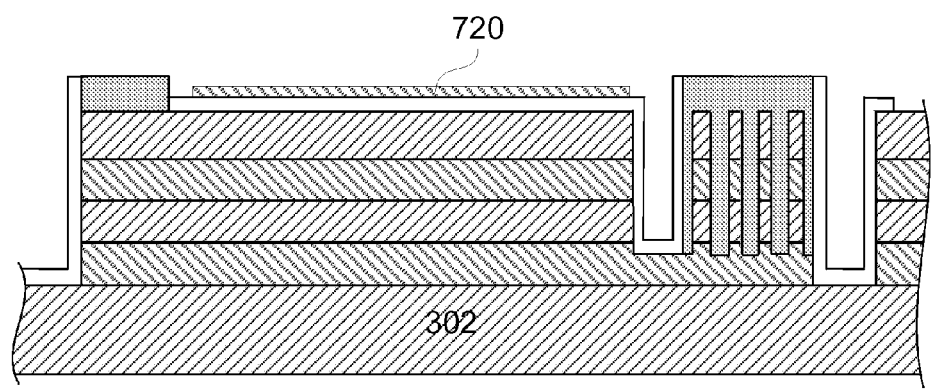
Figure 7C:
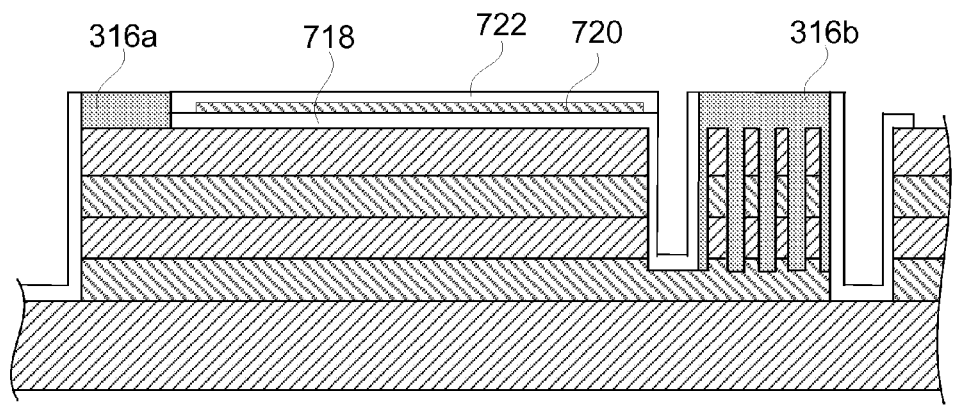
Figure 7D:
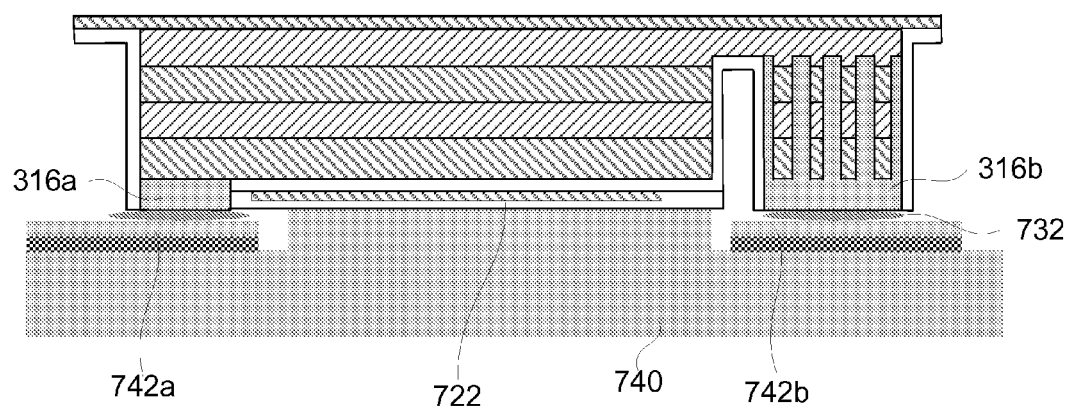
Figure 8A:
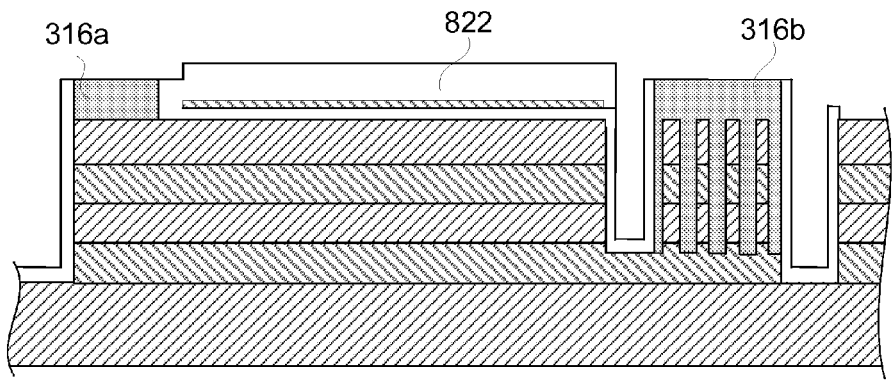
Figure 8B:
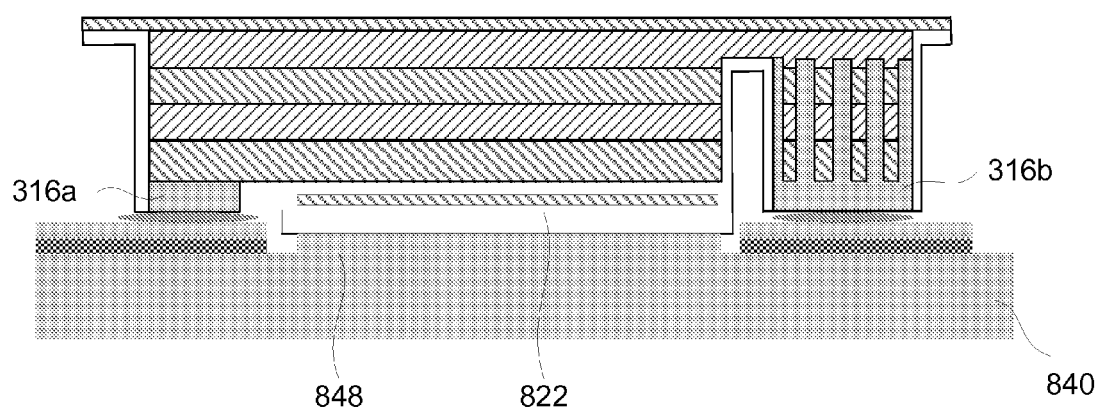
Figure 9A:
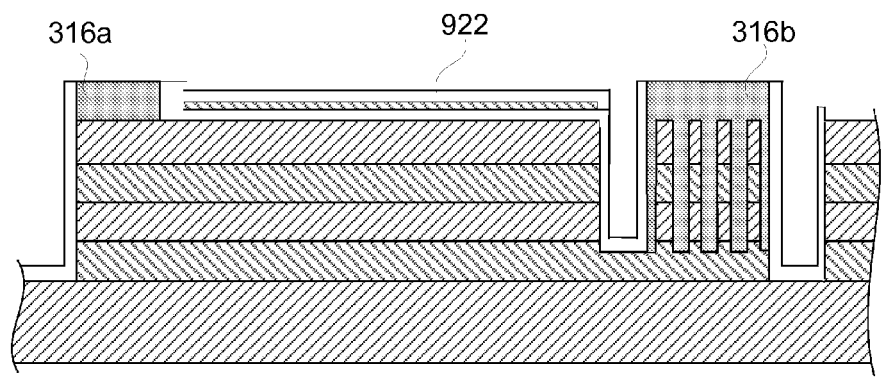
Figure 9B:
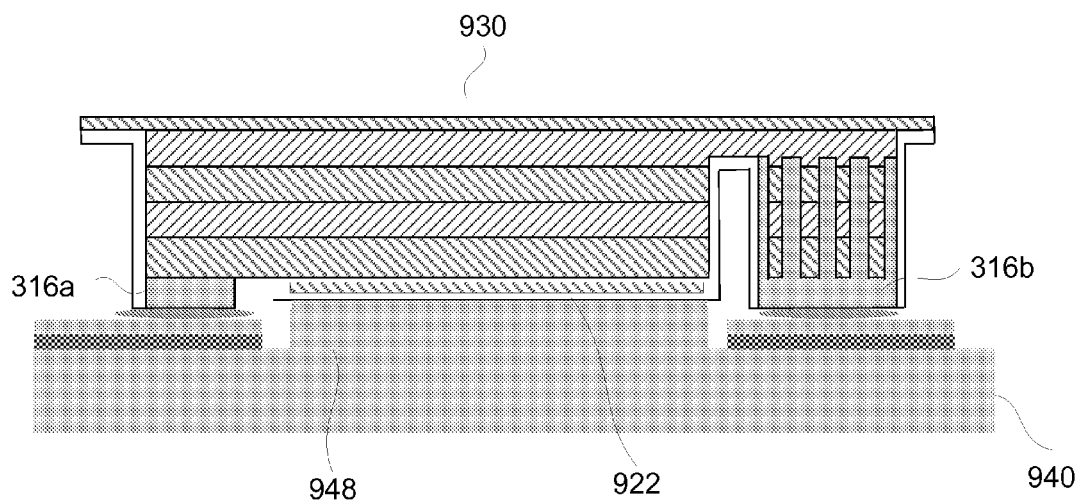
Figure 10A:
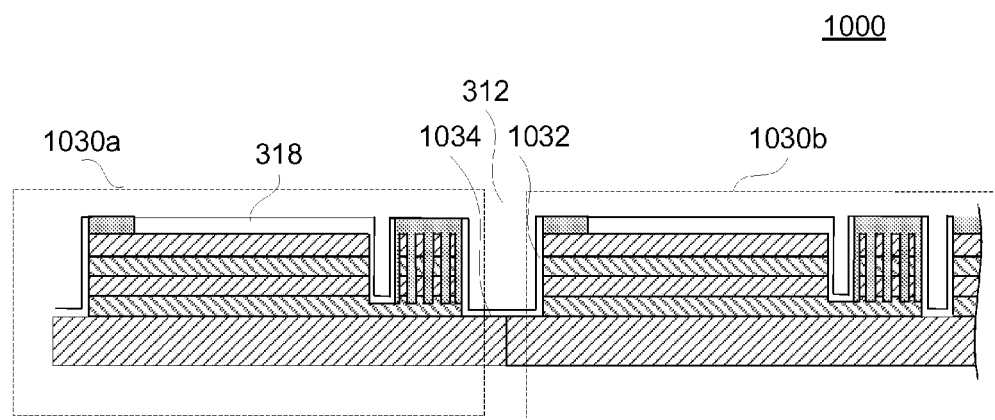
Figure 10B:
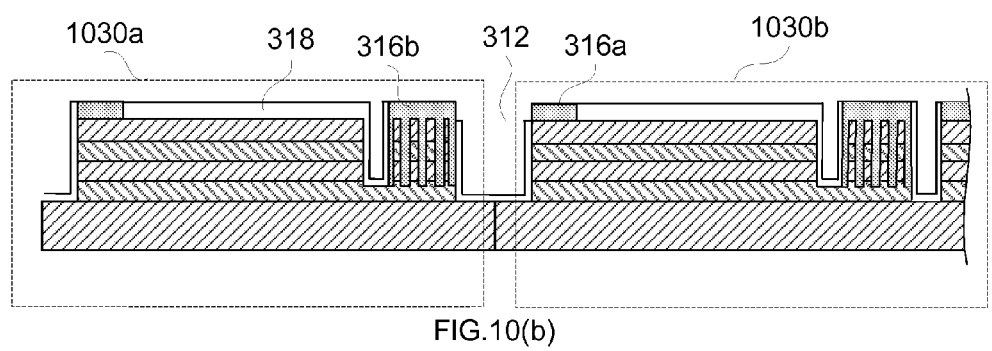
Figure 10C:
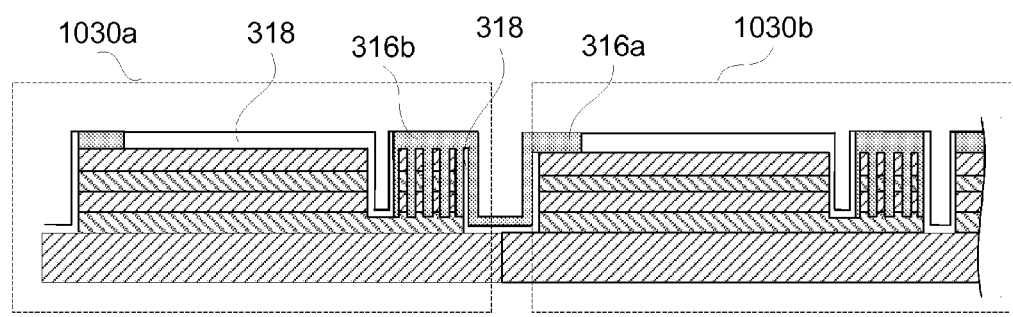
Figure 10D:
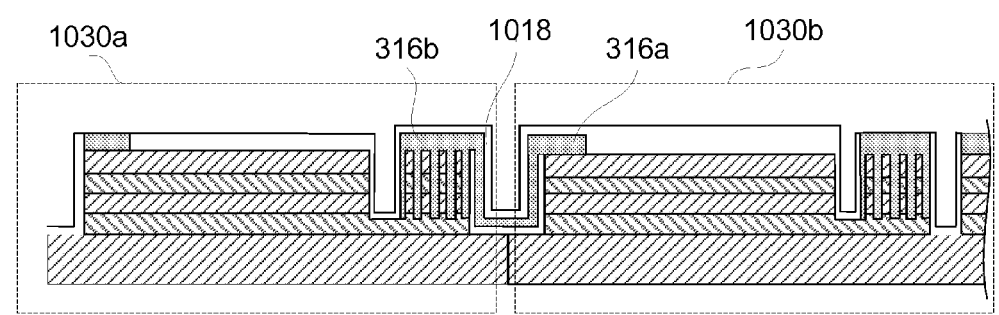
Figure 11A:
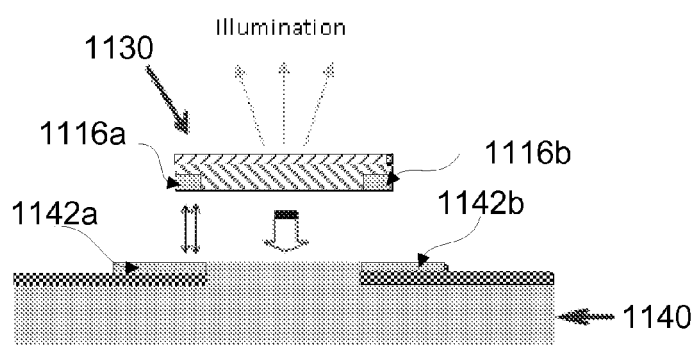
Figure 11B:
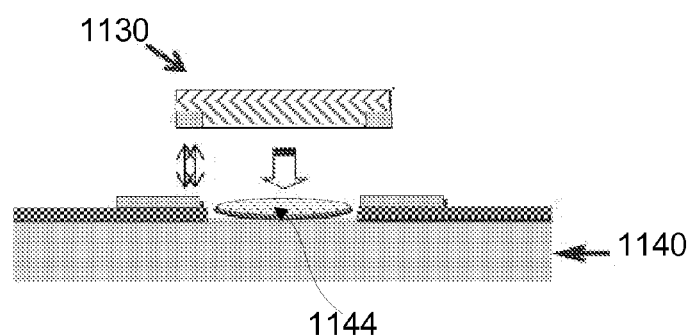

FIGS. 5(a)-5(b) are cross-sectional views to illustrate an alternative example embodiment of FIGS. 3(f) and 3(g);

FIGS. 6(a)-6(b) are cross-sectional views to illustrate an alternative example embodiment of FIGS. 3(f) and 3(g);

FIGS. 7(a)-7(e) are cross-sectional views to illustrate an alternative example embodiment of FIGS. 3(f)-3(h);

FIGS. 8(a)-8(b) are cross-sectional views to illustrate an alternative example embodiment of FIGS. 7(c)-7(d);

FIGS. 9(a)-9(b) are cross-sectional views to illustrate an alternative example embodiment of FIGS. 7(c)-7(d);

FIGS. 10(a)-10(d) are cross-sectional views to illustrate process of fabricating a flip light emitting diode chipset according to one example embodiment of the present invention; and FIGS. 11(a)-11(b) illustrate cross-sectional views of assembling a light emitting diode chip to a printed circuit board according to example embodiments of the present invention.

DETAILED DESCRIPTION

The present disclosure now will be described more fully with reference to the accompanying drawings, in which some, but not all embodiments of the disclosure are shown. This disclosure may be embodied in many different forms and should not be construed as limited to the embodiments set forth; rather, these example embodiments are provided so that this disclosure will be thorough and complete, and will fully convey the scope of the disclosure. Like numbers refer to like elements throughout.

FIGS. 3(a)-3(f) are cross-sectional views that illustrate a method of fabricating a flip light emitting diode chip according to one example embodiment of the present invention. As illustrated in FIG. 3(a), the method includes growing an epitaxial structure 304 on a substrate 302. The epitaxial structure 304 may include a first layer 304a, an active layer 304b on the first layer 304a and a second layer 304c on the active layer 304b. The first layer 304a and the second layer 304c may include a first material. The active layer 304b may include a second material that has narrower band gap than that of the first material. The first layer 304a and the second layer 304c may include different types of doping. For instance, the first layer 304a may be an n-doped semiconductor layer. The second layer 304c may be a p-doped semiconductor layer. An additional layer, such as an adhesion layer, a seed layer or a buffer layer (not shown) may be deposited on the substrate 302 prior to the growth of the epitaxial structure 304 to improve the adhesion between the epitaxial structure 304 and the substrate 302.

The substrate 302 may include $Al_2O_3$ or any other insulating material such as SiC, ZnO, MgO, $Ga_2O_3$, AlGaN, GaLiO, AlLiO, or Si. In one embodiment, the active layer 304b may include at least one of indium gallium nitride (InGaN), AlGaAs, GaP, AlInGaP, or GaAsP. The first and second layers 304a and 304c may include gallium nitride (GaN), or Gallium Arsenide (GaAs). The epitaxial structure 304 may be deposited on the substrate 302 by metal organic chemical vapor deposition (MOCVD) process or any other suitable deposition processes.

The method may further include depositing a conductive layer 310 on the epitaxial structure 304 as shown in FIG. 3(b). The conductive layer 310 may be deposited by metal film deposition methods such as physical vapor deposition (PVD). The conductive layer 310 may include at least one of conductive materials that have light reflection properties, such as Ag, Al, Rh, Ti, Ni, W, Mo, Cr, Pt and Pd. In an alternative embodiment, the conductive layer 310 may include at least one of materials that have translucent or transparent properties or insufficient reflective properties, such as $In_2O_3$, $SnO_2$, IMO, ZnO, IZO, ITO, Ni, Au, Ti or Ni.

An additional layer (not shown), such as an adhesion layer, a seed layer or a buffer layer, may be deposited on the epitaxial structure 304 prior to the deposition of the conductive layer 310. The additional layer may include at least one of conductive materials, such as Ti, Ni, Sn, Cr and WTi.

A photolithography process may then be applied to transfer a pattern on a photomask to a light-sensitive photoresistor. Reactive ion etching process may be used to selectively remove parts of the layers (304a, 304b, 304c, 310) previously deposited on the substrate 302, resulting in a space 312 that extends from surface of the conductive layer 310 to the substrate 302 to expose part of the substrate 302, as shown in FIG. 3(c). The space 312 may separate adjacent light emitting diode dies that are described in detail in FIGS. 11(a) and 11(b) and may also be used to separate a die from a wafer in later packaging process.

Referring to FIG. 3(d), another photolithography and etching process may be applied to form a plurality of trenches (e.g., first trenches 314a, a second trench 314b) that extend from surface of the conductive layer 310 to the first layer 304a to expose part of the first layer 304. The trenches may have different sizes in accordance with their uses. For instance, the second trench 314b having a larger width may be used for isolating a contact pad from layers (304b, 304c, 310) in later fabrication process. The trench(es) with a smaller width(s), for example the first trenches 314a, may be used for forming a contact pad connecting to the first layer 304a in next step shown in FIG. 3(e). The first trenches 314a may be in various forms. In an example embodiment, the first trenches 314a may be in the form of columns. A 3D view and a top view of columns of the first trenches 314a are illustrated in FIGS. 4(a) and 4(b), respectively. Alternatively, the first trenches 314a may be in the form of grids as shown in FIG. 4(c) and/or meshes as shown in FIG. 4(d).

To form contact pads for the light emitting diode device, a layer of conductive material may be deposited on the surface of the wafer. A photolithography process may subsequently be applied to remove undesired conductive material to form a first contact pad 316a and a second contact pad 316b on the conductive layer 310. The first contact pad 316a covers a portion of the conductive layer 310 on one side of the second trench 314b. The second contact pad 316b on the other side of the second trench 314b covers surfaces of the conductive layer 310 between adjacent first trenches 314a and electrically connects to the first layer 304a by filling the conductive material in the first trenches 314a, as shown in FIG. 3(e). The electric connections formed by the trenches 314a between the second contact pad 316b and the first layer 304a may result in lower contact resistance and higher driving current, thus reducing heat generated on the first layer 304a. The conductive material of the first contact pad 316a and the second contact pad 316b may include at least one of Ti, Ni, Au, Cr, Ag, Al, Cu and W.

A passivation layer may be deposited over the wafer followed by applying a photolithography process to remove undesired passivation material from the first and second contact pads 316a and 316b and obtain a desired thickness of the passivation layer. In one embodiment, the passivation layer, such as a passivation layer 318 shown in FIG. 3(f), may be formed at the same plane level as that of the first and second contact pads 316a and 316b.

Subsequent to the deposition of the passivation layer 318, the substrate may be chemically or mechanically polished to a desired thickness. The wafer may be diced into individual light emitting diode chip, resulting in a plurality of light emitting diode chips per wafer. In an assembly process illustrated in FIG. 3(g), a light emitting diode chip 330 is flipped over so that the contact pads 316a and 316b face down. To attach the flip light emitting diode chip 330 onto a metal core printed circuit board 340, conductive bonder 332, such as solder paste or conductive epoxy, are re-melted to produce an electric connection between the contact pads (316a, 316b) of the light emitting diode chip 330 and conductive pads (342a, 342b) of the metal core printed circuit board 340 using one of reflow solder process, thermal cure, ultrasonic and ultraviolet methods. On top surface the metal core printed circuit board 340 and between the two conductive pads 342a and 342b, a metal mesa structure 348 may physically contact the passivation layer 318 resulting in an acceleration of heat dissipation from the flip light emitting diode chip 330 to the metal core printed circuit board 340 in operation.

In an instance in which a metal core printed circuit board has no metal mesa structure, as a metal core printed circuit board 340' shown in FIG. 3(h), there may be a space existing between the flip light emitting diode chip 330 and the metal core printed circuit board 340'. To couple the flip light emitting diode chip 330 to the metal core printed circuit board 340', dielectric thermal-conductive material 344 may be filled in the space that may improve thermal dissipation. Alternatively, the coupling between the flip light emitting diode chip and the metal core printed circuit board may be made by altering the thickness of the passivation layer 318 during the deposition and photolithography processes.

Depending on the various heights of the metal mesa structure of the metal core printed circuit boards (including the embodiment that has no metal mesa structure) the passivation layer may be thicker or thinner than that illustrated in FIG. 3(f). In an example embodiment illustrated in FIGS. 5(a) and 5(b), because the surface of a metal mesa structure 548 of a metal core printed circuit board 540 is lower than that of the first and second contact pads 516a and 516b of a light emitting diode chip 530, a thicker passivation layer 518 may be formed to allow the metal mesa structure 548 to physically contact the passivation layer 518. In another example embodiment illustrated in FIGS. 6(a) and 6(b), the surface of a metal mesa structure 648 of a metal core printed circuit board 640 is higher than that of the first and second contact pads 616a and 616b of a light emitting diode chip 630, a thinner passivation layer 618 is formed to allow the metal mesa structure 648 physically contact the passivation layer 618.

In another embodiment, the passivation layer 318 illustrated in FIG. 3(f) may have a lower surface than that of the contact pads 316a and 316b. A passivation layer 718 having a lower surface is illustrated in FIG. 7(a). In this embodiment, a reflective layer 720 may be deposited to cover at least a portion of a passivation layer 718 and to reflect light toward the substrate 302, as illustrated in FIG. 7(b). The reflective layer 720 may include at least one of the reflective materials that have light reflection properties, such as Ag, Al, Rh, Ti, Ni, W, Mo, Cr, Pt and Pd. A second passivation layer 722 may then be deposited to cover the reflective layer 720, as shown in FIG. 7(c) and followed by applying a photolithography process to selectively remove part of the passivation material from the first and second contact pads 316a and 316b and obtain a desired thickness of the second passivation layer 722. The passivation layer 722 may have different thickness depending on the application.

In one embodiment as illustrated in FIG. 7(c), the surface of the passivation layer 722 may be at the same plane level as that of the first and second contact pads 316a and 316b. An additional layer, such as an adhesion layer, a seed layer or a buffer layer (not shown) may be sandwiched between the passivation layer 718 and the reflective layer 720 depending on the strength of the adhesion between the reflective and passivation materials. Similar to the assembly process described in FIG. 3(g), subsequent to the deposition of the passivation layer 722, the substrate may be chemically or mechanically polished to a desired thickness. The wafer may be diced into individual light emitting diode chip, resulting in a plurality of light emitting diode chips per wafer. As illustrated in FIG. 7(d), a light emitting diode chip 730 is flipped over so that contact pads 316a and 316b face down. To attach the flip light emitting diode chip 730 onto a metal core printed circuit board 740, conductive bonder 732 are re-melted to produce an electric connection between the contact pads (316a, 316b) of the light emitting diode chip 730 and the conductive pads (742a, 742b) of the metal core printed circuit board 740 using one of a reflow solder process, a thermal cure, an ultrasonic and ultraviolet methods, or any other suitable method. On the top surface of the metal core printed circuit board 740 and between the two conductive pads 742a and 742b, a metal mesa structure 748 may physically contact the passivation layer 722 resulting in an acceleration of heat dissipation from the flip light emitting diode chip 730 to the metal core printed circuit board 740 in operation.

Figure 7E:
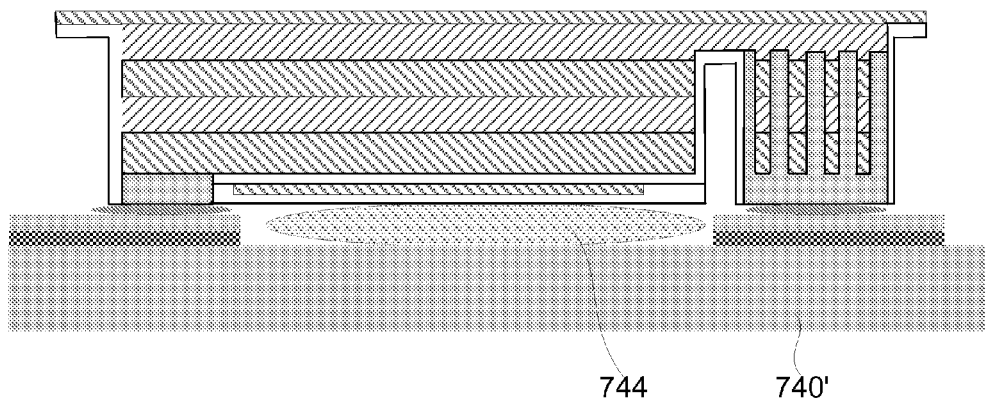

Similar to the metal core printed circuit board 340' shown in FIG. 3(h), a metal core printed circuit board 740' has no metal mesa structure on its top surface as shown in FIG. 7(e). A space may exist between the flip light emitting diode chip 730 and the metal core printed circuit board 740'. To couple the flip light emitting diode chip 730 to the metal core printed circuit board 740' dielectric thermal-conductive material 744 may be filled in the space to improve thermal dissipation. Alternatively, the coupling between a flip light emitting diode chip and a metal core printed circuit board may be made by altering the thickness of any or all of the first passivation layer 718, the reflective layer 720 and the second passivation layer 722 during the deposition and photolithography process. Example embodiments of altering thickness of the second passivation layer 722 are illustrated by FIGS. 8(a)-8(b) and FIGS. 9(a) and 9(b).

With reference to FIGS. 8(a) and 8(b), a metal core printed circuit board 840 having a metal mesa structure 848 with a lower surface than that of the first and second contact pads 316a and 316b may be assembled to a light emitting diode chip 830 having a thicker second passivation layer 822. With reference to FIGS. 9(a) and 9(b), a metal core printed circuit board 940 having a metal mesa structure 948 with a higher surface than that of the first and second contact pads 316a and 316b, may be assembled to a light emitting diode chip 930 having a thinner second passivation layer 922.

The passivation layers, such as the passivation layers 318, 518, 618 and 718 and the second passivation layers 322, 722, 822 and 922 may include passivation material such as $SiO_2$, $Si_3N_4$, $Al_2O_3$, AlN, TiO or $Ta_2O_5$.

FIGS. 10(a)-10(c) are cross-sectional views to illustrate a method of fabricating a flip light emitting diode chipset 1000 according to one example embodiment of the present invention. The light emitting diode chipset 1000 including a plurality of light emitting diode dies, such as a light emitting diode die 1030a and a light emitting diode die 1030b. Each light emitting diode die is not limited to having a single passivation layer. The surface of the most upper layer is not limited to being at the same plane level as that of contact pads of each light emitting diode chip. In this embodiment, in order to describe concisely and briefly, the light emitting diode dies 1030a and 1030b are fabricated using the same fabrication process described in FIGS. 3(a)-3(f). Other fabrication processes described above may be used.

Referring to FIG. 10(a), the space 312 formed in FIG. 3(c) may separate the first light emitting diode die 1030a from the second light emitting diode die 1030b. The passivation layer 318 deposited over the wafer may cover sidewall 1032 and bottom wall 1034 of the space 312. A photolithography process may be applied to remove part of the passivation layer 318 on the sidewall 1032 of the space 312 to expose part of the sidewall of the second contact pad 316b of the first light emitting diode die 1030a and part of the sidewall of the first contact pad 316a of the second light emitting diode die 1030b, as illustrated in FIG. 10(b). As shown in FIG. 10(c), a layer of conductive material may then be deposited to cover the surface of the passivation layer 318 in the space 312 thus electrically connecting the second contact pad 316b of the first light emitting diode die 1030a to the first contact pad 316a of the second light emitting diode die 1030b. A passivation layer 1018 may be applied over the second contact pad 316b of the first light emitting diode die 1030a, surface of the conductive material in the space 312 and the first contact pad 316a of the second light emitting diode die 1030b, as shown in FIG. 10(d). Hence, adjacent light emitting diode dies are electrically connected. A light emitting diode chipset is obtained. The light emitting diode chipset may be assembled to a metal core printed circuit board (not shown) by connecting a plurality of the first and second conduct pads 316a and 316b to a plurality of first and second conductive pads (not shown) of the metal core printed circuit board, respectively.

FIGS. 11(a) and 11(b) illustrate chip on board assemblies according to example embodiments of the present invention. As illustrated in FIG. 11(a), contact pads 1116a and 1116b of a light emitting diode chip 1130 face down. To attach the flip light emitting diode chip 1130 onto a metal core printed circuit board 1140, conductive bonders (not shown) are re-melted to produce an electric connection between the contact pads (1116a, 1116b) of the light emitting diode chip 1130 and conductive pads (1142a, 1142b) of the metal core printed circuit board 1140 using one of reflow solder process, thermal cure, ultrasonic and ultraviolet methods or any other suitable methods. The flip light emitting diode chip 1130 may physically contact the metal core printed circuit board 1140 as illustrated in FIG. 11(a). Alternatively, dielectric thermal-conductive material 1144 may be filled in a space between the flip light emitting diode chip 1130 and the metal core printed circuit board 1140, as illustrated in FIG. 11(b), to improve thermal dissipation.

Many modifications and other example embodiments set forth herein will come to mind to which these example embodiments pertain having the benefit of the teachings presented in the foregoing descriptions and the associated drawings. Therefore, it is to be understood that the embodiments are not to be limited to the specific ones disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims. Although specific terms are employed herein, they are used in a generic and descriptive sense only and not for purposes of limitation.

That which is claimed:

1. A method of fabricating a light emitting diode die, comprising:
    providing a substrate;
    providing an epitaxial structure on the substrate, a first layer on the substrate, an active layer on the first layer and a second layer on the active layer;
    depositing a conductive and reflective layer on the second layer of the epitaxial structure;
    forming an array of first trenches, a second trench on one side of the first trenches and a space on the other side of the first trenches, each of the first trenches and the second trench extending from surface of the conductive and reflective layer into the first layer to expose part of the first layer, the space extending from surface of the conductive and reflective layer to the substrate to expose part of the substrate;
    depositing conductive material to cover a portion of surface of the conductive and reflective layer to form a first contact pad, and surfaces between adjacent first trenches to form a second contact pad, wherein the second contact pad electrically connects the first layer by filling the conductive material in the first trenches, and wherein the first contact pad is spatially separated from the second contact pad by the second trench; and
    depositing a first passivation layer over uncovered portion of surface of the conductive and reflective layer to form a first planar passivation contact surface between the first contact pad and the second trench, the first passivation layer comprising a first passivation material.

2. The method of claim 1, further comprising
    applying a photolithography process to transfer patterns on a photomask to the conductive and reflective layer; and
    selectively removing parts of the first layer, the active layer, the second layer and the conductive and reflective layer to form the array of the first trenches,
    wherein the patterns include at least one of column arrays, row arrays, bar arrays, grids and meshes.

3. The method of claim 1, further comprising applying a photolithography process subsequent to the deposition of the conductive material to selectively remove parts of the conductive material to form the first and second contact pads.

4. The method of claim 1, further comprising
    applying a planarization process and an etching process to the first contact pad, the second contact pad and the first passivation layer to obtain a desired thickness of the first passivation layer, wherein the first planar passivation contact surface is at the same plane level as, higher or lower than that of the first and second contact pads.

5. The method of claim 1, depositing the first passivation layer further comprising depositing the first passivation material over side wall and bottom wall of the second trench, side wall and bottom wall of the space.

6. The method of claim 1 further comprising depositing a reflective layer to cover a portion of the first passivation layer, the reflective layer including reflective material having reflective properties.

7. The method of claim 6, further comprising depositing one of an adhesion layer, a seed layer and a buffer layer prior to the deposition of the reflective layer.

8. The method of claim 6 further comprising
    depositing a second passivation layer subsequent to the deposition of the reflective layer to form a second planar passivation contact surface to cover surface of the reflective layer, the second passivation layer including a second passivation material,
    applying a planarization process and an etching process to the first contact pad, the second contact pad and the second passivation layer to obtain a desired thickness of the second passivation layer, wherein the second planar passivation contact surface is at the same plane level as, higher or lower than that of the first and second contact pads.

9. The method of claim 1, further comprising depositing one of adhesion layer, seed layer or buffer layer on the substrate prior to one of steps of providing the epitaxial structure, depositing the conductive and reflective layer and depositing the conductive material to form the contact pads.

10. The method of claim 1, further comprising
    grinding the substrate to a desired thickness, and
    obtaining the light emitting diode die by dicing.

11. A light emitting diode die comprising:
    a substrate;
    an epitaxial structure on the substrate, the epitaxial structure including
        a first layer having a first material;

an active layer on the first layer, the active layer having a second material; and a second layer on the active layer, the second layer having the first material, the first layer and the second layer including different types of doping, the first material having wider band gap than that of the second material;

a conductive and reflective layer deposited on the epitaxial structure;

a first contact pad formed on the conductive and reflective layer covering a portion of surface of the conductive and reflective layer; and a second contact pad covering surfaces between adjacent first trenches, the first trenches extending from the conductive and reflective layer into the first layer to expose part of the first layer, wherein the second contact pad electrically connects to the first layer by filling conductive material in the first trenches;

a second trench extending from the conductive and reflective layer to the first layer to expose part of the first layer, wherein the second trench and a portion of uncovered surface of the conductive and reflective layer spatially separates the first contact pad from the second contact pad;

a space extending from surface of the conductive and reflective layer to the substrate to expose part of the substrate, the first trenches formed between the second trench and the space; and a first passivation layer formed over uncovered surface of the conductive and reflective layer to form a first planar passivation contact surface between the first contact pad and the second trench, the first passivation layer comprising a first passivation material.

12. The light emitting diode die of claim 11, wherein the first trenches are formed by applying a photolithography process to transfer patterns on a photomask to the conductive and reflective layer and selectively remove parts of the epitaxial structure and the conductive and reflective layer to form the first and second trenches, wherein the patterns include at least one of column array, row array, bar array, grids and meshes.

13. The light emitting diode die of claim 11 further comprises one of an adhesion layer, a seed layer and a buffer layer, wherein the one of the adhesion layer, seed layer and buffer layer is sandwiched between the substrate and the epitaxial structure, or between the conductive and reflective layer and the second layer.

14. The light emitting diode die of claim 11, wherein the substrate includes at least one of $Al_2O_3$, SiC, ZnO, MgO, $Ga_2O_3$, AlGaN, GaLiO, AlLiO and Si.

15. The light emitting diode die of claim 11, wherein the first and second layer includes at least one of gallium nitride and gallium arsenide.

16. The light emitting diode die of claim 11, wherein the active layer includes at least one of indium gallium nitride, AlGaAs, GaP, AlInGaP and GaAsP.

17. The light emitting diode die of claim 11, wherein the conductive and reflective layer includes at least one of Ag, Al, Rh, Ti, Ni, W, Mo, Cr, Pt and Pd or one of $In_2O_3$, $SnO_2$, IMO, ZnO, IZO, ITO, Ni, Au, Ti and Ni.

18. The light emitting diode die of claim 11, wherein at least one of the first and second contact pads includes at least one of Ti, Ni, Au, Cr, Al and Ag.

19. The light emitting diode die of claim 11, further comprising one of an adhesion layer, a seed layer and a buffer layer sandwiched between the epitaxial structure and the conductive and reflective layer, wherein the adhesion layer, the seed layer and the buffer layer includes at least one of Ti, Ni, Sb, Cr and WTi.

20. The light emitting diode die of claim 11, wherein the first planar passivation contact surface of the first passivation layer is at the same plane level as, higher or lower than that of the first and second contact pads and wherein the first passivation layer includes at least one of $SiO_2$, $Si_3N_4$, $Al_2O_3$, AlN, TiO and $Ta_2O_5$.

21. The light emitting diode die of claim 20, further comprising a reflective layer covering a portion of the surface of the first passivation layer, wherein the reflective layer includes at least one of Ag, Al, Rh, Ti, Ni, W, Mo, Cr, Pt and Pd.

22. The light emitting diode die of claim 21, further comprising a second passivation layer covering the reflective layer to form a second planar passivation contact surface, wherein the second planar passivation contact surface of the second passivation layer is at the same plane level as, higher or lower than that of the first and second contact pads and wherein the second passivation layer includes at least one of SiO2, $Si_3N_4$, $Al_2O_3$, AlN, TiO and $Ta_2O_5$.

23. A light emitting diode device, comprising:
a light emitting diode die, comprising
a first contact pad,
a second contact pad, and
a planar passivation contact surface, the planar passivation contact surface formed between the first contact pad and the second contact pad;
a metal core printed circuit board, comprising
a first conductive pad, the first conductive pad located above the metal core,
a second conductive pad, the second conductive pad located above the metal core, and
a mesa structure, the mesa structure extending from the metal core and positioning between the first conductive pad and the second conductive pad,
wherein the first and second contact pads are electrically connected to the first and second conductive pads of the metal core printed circuit board respectively, and wherein the planar passivation contact surface is in contact with the mesa structure.

24. The light emitting diode device of claim 23, wherein the first and second contact pads are electrically connected to the first and second conductive pads of the metal core printed circuit board by means of one of conductive bonders, conductive epoxy, eutectic contact, solder and solder paste.

25. The light emitting diode device of claim 23, wherein the mesa structure is made of thermal conductive material including at least one of metal, ceramic, solder paste and solder.

26. The light emitting diode device of claim 23, wherein the planar passivation contact surface is coupled to the mesa structure by means of one of direct contact, filling thermal conductive epoxy, solder and solder paste in a space between the planar passivation contact surface and the surface of the mesa structure.

27. The light emitting diode device of claim 23, wherein the surface of the mesa structure is at the same plane level as the first and second conductive pads when the planar passivation contact surface is at the same plane level as that of the first and second contact pads, wherein the surface of the mesa structure is higher than that of the first and second conductive pads when the planar passivation contact surface is lower than that of the first and second contact pads, and wherein the surface of the mesa structure is lower than that of the first and second conductive pads when the planar passivation contact surface is higher than that of the first and second contact pads.

* * * * *